June 19, 1962 M. W. BYCZKOWSKI 3,040,218

CONSTANT CURRENT DEVICES

Filed March 10, 1959

MIECZYSLAW BYCZKOWSKI
INVENTOR.

BY [signature]

ATTORNEY

United States Patent Office 3,040,218

Patented June 19, 1962

3,040,218

CONSTANT CURRENT DEVICES

Mieczyslaw W. Byczkowski, Chicago, Ill., assignor to Hoffman Electronics Corporation, a corporation of California Filed Mar. 10, 1959, Ser. No. 798,535
8 Claims. (Cl. 317—234)

The present invention relates to constant current devices, and more particularly to semiconductor constant current devices.

While there are many types of constant voltage devices, there are few constant current devices, and these few have limitations that make them unsatisfactory. There is, accordingly, a great need for a new device in which the current is independent of the voltage.

It is an object of the present invention, therefore, to provide a novel constant current device.

It is another object of the present invention to provide a semiconductor device in which the current is largely independent of the reverse bias voltage.

According to the present invention, a constant current device comprises a semiconductor covered by conversion and oxide layers.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which, FIGURE 1 is a plan view of a semiconductor according to the present invention.

Figure 1:
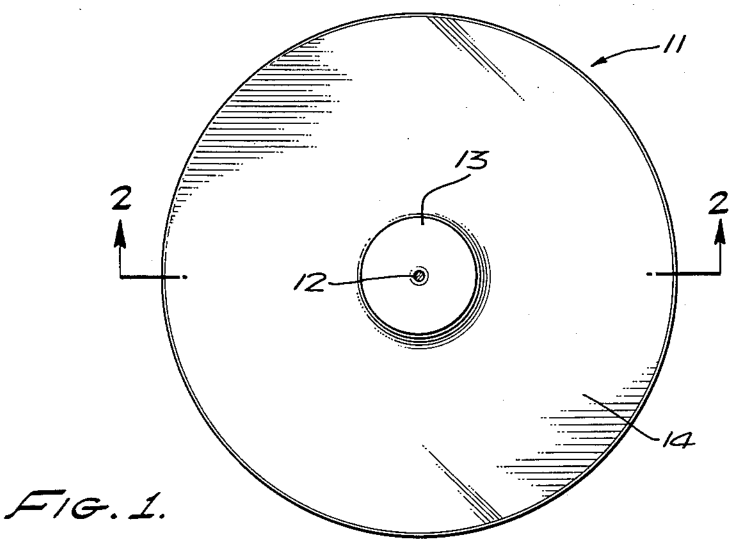
Figure 2:
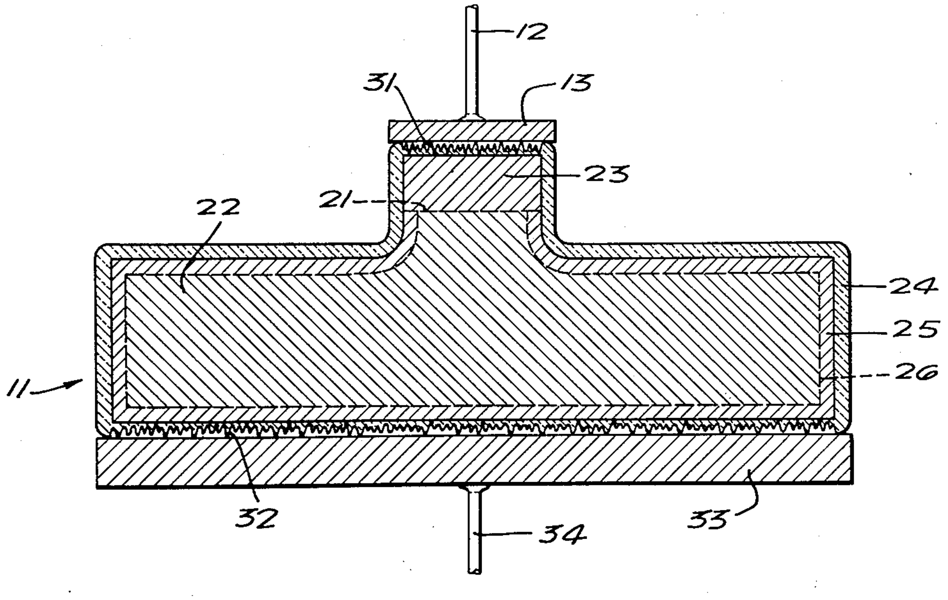

FIGURE 2 is a sectional view taken along line 2—2 of FIGURE 1.

Referring now to the drawings, FIGURE 1 shows silicon semiconductor 11 having lead 12 connected to contact 13. Semiconductor 11 is covered by oxide layer 14.

FIGURE 2 shows p-n junction 21 of semiconductor 11 in the region between p-type region 22 and n-type region 23. The portion of region 23 that is most distant from p-n junction 21 was made degenerate by heavy diffusion with phosphorus until it became metallic in behavior, in order to make an ohmic contact possible. Semiconductor 11 has been plateau etched and is covered by n-type silicon oxide layer 24, under which lies very thin n-type conversion layer 25. Barrier 26 separates p-type region 22 from n-type conversion layer 25, which may be obtained by diffusing a minute amount of n-type impurity through oxide layer 24. Oxide layer 24 contains pitted regions 31 and 32, obtained by etching with hydrofluoric acid. Pitted regions 31 and 32 are soldered to contacts 13 and 33, respectively, which in turn are connected to leads 12 and 34, respectively. The soldering can form a tin to oxide bond, or a silver paste may be used. If desired, oxide layer 24 could be removed entirely from the top and bottom to permit direct contact between semiconductor 11 and contacts 13 and 33, respectively, although the performance of semiconductor 11 would then not be as satisfactory.

The operation of the present invention can be explained by the field-effect, that is, the widening of the space charge region into the thin conductive layer. The resulting decrease in the cross-sectional area of the current path causes the original impedance to increase, until the space charge extends over the entire width of the conducting region and "pinches off" the "channel." A further increase in the reverse bias voltage does not affect the "channel" appreciably, but it does increase the depleted region in the lengthwise direction of the channel. The result is a constant saturation current over a wide range from "pinch-off" to the breakdown of the junction. The saturation current can be controlled by varying the thickness and impurity constant of the oxide layer, the resistivity of the original semiconductor material, or the junction depth, and, therefore, the width of the depletion region.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A constant current device comprising: a first region of a first conductivity type; a second region of a second conductivity type; a p-n junction in the region where said first region meets said second region; a thin conversion layer of said second conductivity type and of substantially uniform depth covering the outer surface of said first region; a barrier separating said conversion layer from said first region; an oxide layer of said second conductivity type covering at least a major portion of said conversion layer; a first lead ohmically coupled to said conversion layer; and a second lead ohmically coupled to said second region.

2. Apparatus as defined in claim 1 in which said oxide layer has a pitted region in the vicinity of each of said first and second leads.

3. Apparatus as defined in claim 2 including, in addition, a first metal contact soldered to one of said pitted regions, and a second metal contact soldered to the other one of said pitted regions, said first and second contacts being connected to said first and second leads, respectively.

4. Apparatus as defined in claim 3 in which the portion of said second region where said second metal contact is connected to it is degenerate.

5. Apparatus as defined in claim 4 in which said device is plateau etched and disc-like in shape, said conversion layer completely covers said first region, said first conductivity type is p-type, said second conductivity type is n-type, said first and second regions comprise silicon, and said oxide layer comprises an oxide of silicon.

6. Apparatus as defined in claim 1 in which said device is plateau etched and disc-like in shape.

7. A constant current device comprising: a first region of a first conductivity type; a second region of a second conductivity type; a p-n junction in the region where said first region meets said second region; a thin conversion layer of substantially uniform depth and of said second conductivity type covering solely said first region; a barrier separating said conversion layer from said first region; an oxide layer of said second conductivity type covering at least a major portion of said conversion layer; a first lead ohmically coupled to said conversion layer; and a second lead ohmically coupled to said second region.

8. Apparatus as defined in claim 7 in which said oxide layer completely covers said conversion layer and has a pitted region in the vicinity of each of said first and second leads, said device is plateau etched and disc-like in shape, and the portion of said second region where said second lead is coupled to it is degenerate.

References Cited in the file of this patent

UNITED STATES PATENTS 2,899,344 Atalla et al. ............ Aug. 11, 1959